(12) United States Patent
Bonitz

(10) Patent No.: US 6,237,126 B1
(45) Date of Patent: *May 22, 2001

(54) ELECTRICAL ANALYSIS OF INTEGRATED CIRCUITS

(75) Inventor: Rainer Bonitz, Bad Aibling (DE)

(73) Assignee: STMicroelectronics GmbH, Grasbrunn (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/012,138

(22) Filed: Jan. 23, 1998

(30) Foreign Application Priority Data

Jan. 24, 1997 (DE) ............................................. 197 02 600

(51) Int. Cl.[7] ............................... G06F 17/50; G06G 7/62
(52) U.S. Cl. .................................... 716/4; 703/13; 703/14
(58) Field of Search ............................ 395/500.05; 716/4

(56) References Cited

U.S. PATENT DOCUMENTS

| | | | |
|---|---|---|---|
| 4,644,486 | * 2/1987 | Cannon et al. | 364/570 |
| 5,278,769 | * 1/1994 | Bair et al. | 364/490 |
| 5,278,770 | * 1/1994 | Gore et al. | 364/490 |
| 5,379,231 | * 1/1995 | Pillage et al. | 364/488 |
| 5,394,346 | * 2/1995 | Milsom | 364/578 |
| 5,481,484 | * 1/1996 | Ogawa et al. | 364/578 |
| 5,553,008 | * 9/1996 | Huang et al. | 364/578 |
| 5,568,395 | * 10/1996 | Huang | 364/489 |
| 5,617,326 | * 4/1997 | Yamamoto | 364/488 |
| 5,787,269 | * 7/1998 | Hyodo | 395/500 |
| 5,790,436 | * 8/1998 | Chen et al. | 364/578 |
| 5,799,172 | * 8/1998 | Gullapalli et al. | 395/500 |
| 5,818,727 | * 10/1998 | Sekiguchi | 364/490 |
| 5,872,724 | * 2/1999 | Nakada | 364/578 |
| 5,933,356 | * 8/1999 | Rostoker et al. | 364/489 |
| 5,983,381 | * 11/1999 | Chakradhar et al. | 714/738 |
| 6,118,331 | * 9/2000 | Yunus et al. | 327/553 |

FOREIGN PATENT DOCUMENTS

| | | | |
|---|---|---|---|
| 0 481 117 A1 | 4/1992 | (EP) | G06F/15/60 |
| 0 556 900 A2 | 8/1993 | (EP) | G06F/15/60 |

OTHER PUBLICATIONS

Hsu and Rozenblit, "A Computer–Aided Design Framework for Modeling and Simulation of VLSI Interconnections and Packaging," *Integration the VLSI Journal*, pp. 163–187, Jul. 14, 1994.

Becque, Phil et al., Getrennt Spezifizieren, Vereint Simulieren, "*Vereinfachtes Design von Gemischt Analog/Digitalen Systemen*," vol. 20:102–106, 108, 1995.

Thatcher, Thomas J. et al., "Automatic Partitioning and Dynamic Mixed–Mode Simulation," in *Proceedings of the IEEE 1992 Custom Integrated Circuits Conference*, IEEE Electron Devices Society, Boston Massachusetts, May 3–6, 1992, pp. 12.7.1–12.7.4.

R. Beale et al., Design Methodology and Simulation Tools for Mixed Analog–Digital Integrated Circuits, IEEE International Systems on Circuits and Systems, pp. 1351–1355, May, 1990.*

J.A. Connelly et al., Macromodeling with SPICE, Prentice Hall, pp. 6–7, 66–68, 159–165, Jan. 1992.*

* cited by examiner

*Primary Examiner*—Matthew Smith
*Assistant Examiner*—A. M. Thompson
(74) *Attorney, Agent, or Firm*—Theodore E. Galanthay; David V. Carlson; Seed IP Law Group PLLC

(57) ABSTRACT

For an analysis of an electrical behaviour of a specific cell of a monolithically integrated circuit, a simulation model is used which is composed of a fine model part of the cell of interest and a coarse model part of the remainder of the integrated circuit.

55 Claims, 7 Drawing Sheets

ELECTRICAL ANALYSIS OF INTEGRATED CIRCUITS

TECHNICAL FIELD

The invention concerns a method for an analysis of the electrical behavior of monolithically integrated circuits which can be utilized for the improvement of the electromagnetic emission behavior of integrated circuits.

The invention also relates to using computer programs or other automation method to analyze the electrical behavior or the electromagnetic emission behavior or to automatically optimize the same of integrated circuits.

BACKGROUND OF THE INVENTION

Modem monolithically integrated semiconductor circuits with very high degree of integration mostly are so complex that computer programs are used both for the design thereof and for the analysis of their electrical behavior and in part also for their optimization. For example, there are computer programs by means of which electrical circuit diagrams or functional block circuit diagrams can be transferred to layout information by means of which layouts for integrated semiconductor circuits can be formed. On the other hand, there are computer programs by means of which simulation computer models can be prepared from circuit diagrams or layouts of integrated circuits, by means of which the behavior and/or the reaction of the circuits or circuit parts simulated by a computer model can be ascertained or tested.

For example, by means of a computer program named AMPS (Automatic Minimization Of Power through Sizing), it is possible to optimize digital CMOS circuits with regard to power, working speed and space requirement on a semiconductor chip. This program is capable of automatically resizing transistors, i.e., to make them larger and/or smaller so as to find a combination that will best meet user-defined goals concerning power, speed and chip area requirements without changing the functionality of the design of an integrated circuit. This computer program is suitable on the one hand for designing cells of integrated circuits and can be used upon termination of the design of the integrated circuit on the other hand for the verification whether the desired goals have actually been met or whether further improvements are necessary.

A problem with increasing significance in case of integrated semiconductor circuits consists in that interferences with other integrated semiconductor circuits can occur in certain applications by electromagnetic emission of high-frequency interference radiation via supply and functional terminal pins of a semiconductor component or that the semiconductor component concerned is subject to radiation sensitivity with regard to such high-frequency interference radiation. Efforts are thus made to check and optimize the quality of an integrated circuit with respect to emission behavior and/or the radiation sensitivity concerning high-frequency electromagnetic emission already during circuit development.

The publication "Analog System Engineering" by Michael Gutzmannn, pages 8 and 9, describes in the section "Simultaneous switching noise of CMOS Systems" a method of making a simulation model and of performing a simulation in which, for example, a circuit simulation program SPICE can be used. By preparing an R, L, C, G matrix, electrical parameters either of an entire integrated circuit or only of one cell thereof are extracted first, an electrical network of the package with terminal legs and connecting leads as well as a model of I/O circuits (INPUT/OUTPUT circuits) are made, and on the basis of the same a circuit simulation is performed for example by means of the program SPICE. The circuit simulation delivers so-called transient waveforms in the form of a record of the current patterns in terms of time at all circuits nodes of interest of the integrated circuit or cell, respectively.

When this known method is used for modeling and simulating the complete integrated circuit, one can make only a relatively coarse model. For, highly integrated circuits of the type used nowadays are so complex that, if good simulation results for the entire integrated circuit are to be achieved, which necessitates a relatively fine simulation model and sufficiently high resolution by using a correspondingly high scanning rate of the signal patterns obtained by simulation, one would arrive at computing times which, even with the use of fast computers, would by far be too long for practical application. Computing times of about 2 to 3 months would have to be expected.

For obtaining computing times that still are acceptable for practical application, a highly simplified or coarse simulation model and/or a very poor resolution by slow scanning rates would have to be used. Both reduces the required computing time, but often leads to only quite inaccurate results that frequently are not acceptable.

Another possibility consists in preparing a simulation model not of the entire integrated circuit, but only of a cell, i.e., of an extracted functional block, of the integrated circuit. One may indeed arrive thereby at more acceptable computing times by finer simulation models and with higher resolution by use of higher scanning rates. However, the simulation result again is too inaccurate since an entire environment of the simulated cell, namely the remainder of the integrated circuit, package parameters, I/O structures, lead structures, supply voltage structures, etc. are completely left out of consideration, although they may have considerable influence on the function of the simulated cell of the integrated circuit.

SUMMARY OF THE INVENTION

Such problems are to be overcome with the present invention. In particular, simulations are to be rendered possible with acceptable computing times for practical application, which permit a sufficiently qualified statement on the functional behavior, in particular in connection with electromagnetic interference emission, of cells of interest of integrated circuits.

An embodiment of the invention consists in using for the simulation a mixed model which is composed of a fine model part as regards the cell of interest and of a coarse model part as regards the remainder of the integrated circuit, with a possibility of adding to the coarse model part preferably also a lead model and/or a voltage supply model and/or an input/output structure model and/or a package structure model and/or a load model. For preparing the coarse model part, only passive components in the form of complex resistors are taken into consideration, whereas active components, passive components and parasitic components are taken into consideration for making the fine model part.

A resulting fine-coarse computer model on the one hand displays sufficiently low complexity in order to be thus able to perform a simulation with high resolution accuracy and still sufficiently short computing time for practical application, and on the other hand by way of the coarse model part takes into sufficient consideration the electrical environment of the cell having an effect on the electrical behavior of this cell.

For preparing the fine-coarse computer model and for the simulation, known computer programs can be used, for example a program DRACULA for the extraction and the since long proven program SPICE for the simulation.

Conventional simulation methods usually employ digital stimulation signals in the form of stimulation pulses with sloping pulse edges. Such stimulation signals, however, are frequently so remote from the form of actually occurring signals that they are contrary to the achievement of good simulation results.

In a particularly preferred embodiment of the method according to the invention, a fine simulation proper is preceded by a step making available more realistic stimulation signals by means of the fine-coarse computer model, by producing at first a coarse simulation computer model of the entire integrated circuit that takes into account only the active components thereof, and by then performing a coarse simulation with the aid of said coarse simulation computer model by presetting predetermined operational parameters and applying test signals of predetermined signal shape to input terminals of the coarse simulation computer model, and recording and storing analog response signals, occurring then at input and/or output terminals of the cell of interest of the coarse simulation computer model, in the form of stimulation signals which then are used as stimulation signals during the fine simulation. The program DRACULA can be used, e.g., for extraction of the coarse simulation computer model, and for the coarse simulation it is possible to use a mixed mode simulator, for example a program ELDO or a program EPIC.

The method according to the invention can be used advantageously for improving the electromagnetic emission behavior of the cell of interest of the integrated circuit, with a purposeful change of the fine model of the cell being carried out by means of a program-controlled iteration routine and in consideration of predetermined functional limits of the cell, the fine simulation and an assessment thereof being repeated and the iteration being repeated with new changes of the fine model which take into consideration whether the preceding change has led to a better or a worse result, until only such changes result with respect to the electromagnetic emission behavior of the cell which are below a predetermined threshold value.

For the fine simulation and possibly also for the coarse simulation, it is possible to preset for operating parameters either typical values or "worst case" values, i.e., the values to be expected in the worst case of operation. However, it is also possible to carry out the simulations both with typical values and with worst case values.

In recording the signal patterns arising during simulation, a scanning frequency should be used that is at least as high as prescribed by a scanning theorem, i.e., at least twice as high as the highest frequency occurring in the signal pattern. However, preferred is a considerably higher resolution, for example with a scanning frequency that is five times as high as the scanning frequency demanded by the scanning theorem. For example, when signal patterns with a frequency range of 0 to 1 GHz are to be scanned, a scanning rate with a time distance between adjacent scanning pulses of, e.g., 0.2 ns is preferred.

With periodical signal patterns, a Fourier transformation is preferably performed to generate a frequency spectrum of the respective signal pattern. The spectrum analysis can, in case of signal events, also be made by other spectrum analysis methods, for example by a Z transformation (numeric methods). However, in case of signal patterns representing signal events, periodic stimuli may be input to a simulation model to obtain periodic output signal patterns.

Usual extraction methods for preparing a computer model by layout extraction determine, for example, only a resistance and a node capacitance between two circuit nodes of the simulation model. The node capacitance is associated with one of the two circuit nodes, whereas the resistance is associated with the other circuit node. When an electrical distance between the two circuit nodes constitutes a bi-directional connection, this unilateral association of resistance and node capacitance with the one and the other circuit node, respectively, results in falsifications of the stimulation results. For this reason, a preferred embodiment of the method according to the invention provides, during layout extraction, an additional step of an equivalent network formation (e.g., with a program DIVA), in which, for example, resistances and capacitances are distributed according to known line equivalent circuit diagrams in a number of serial resistors and transverse capacitors. This comes considerably closer to the physical reality and thus leads to considerably better simulation results.

In simulating output stages of an integrated circuit, the simulation model thereof is preferably simulated not with a no-load state at the output, but in consideration of a typical load to be expected.

The invention will now be elucidated in more detail by way of non-limitative examples of embodiments shown in the attached drawings.

BRIEF DESCRIPTION OF THE DRAWINGS

FIG. 6 shows a signal pattern at the output terminal pin of an output driver of an integrated circuit without optimization.

FIG. 7 shows a signal pattern at an internal supply voltage line of the integrated circuit without optimization.

FIG. 8 shows a signal pattern at the output terminal pin after iterative optimization.

FIG. 9 shows a signal pattern at an internal ground line of the integrated circuit after iterative optimization.

FIG. 10 shows a frequency spectrum of a signal pattern at the output terminal pin without optimization.

FIG. 11 shows a frequency spectrum of a signal pattern at the internal voltage supply line without optimization.

FIG. 12 shows a frequency spectrum of a signal pattern at the output terminal pin after iterative optimization.

FIG. 13 shows the frequency spectrum of a signal pattern at the internal voltage supply line after iterative optimization.

DETAILED DESCRIPTION OF THE INVENTION

Figure 1:
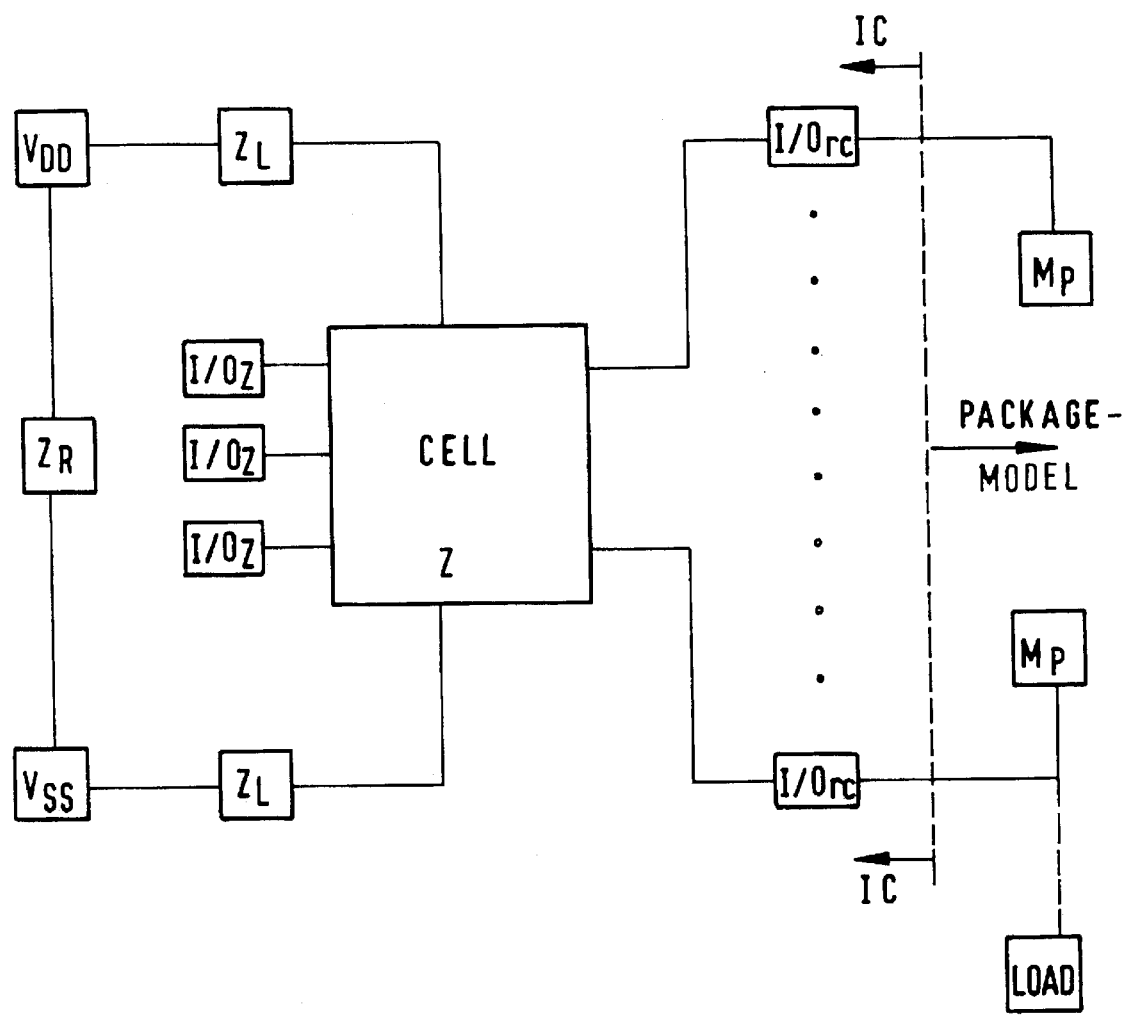
FIG. 1 shows a block circuit diagram of a fine-coarse computer model as it can be used in a simulation method according to the invention.

FIG. 1 shows an example of a fine-coarse computer or simulation model for performing a simulation method according to the invention. The drawing shows the fine-coarse simulation model of an integrated circuit, said fine-coarse simulation model containing a fine model of a cell Z of interest with respect to its electrical behavior, said cell Z having internal inputs/outputs $I/O_Z$, and containing a coarse model of the following components:

a coarse model of $Z_R$ of the remainder of the chip of the integrated circuit IC;

a coarse model $V_{DD}$ and $V_{SS}$ as voltage supply model, a coarse model $Z_L$ as a lead model taking into account the leads to cell Z, $I/O_{IC}$ as input/output structure model which takes into account external input/output terminals of the integrated circuit IC, a coarse model $M_P$ as package model for taking into account electrical parameters of the package and package lines of the integrated circuit, and a coarse model LOAD representing an external load of the integrated circuit.

A preferred embodiment of the method according to the invention proceeds as follows:

1. At first, a coarse simulation computer model is made of the entire integrated circuit, which considers only the active components thereof, such as diodes and transistors. A conventional computer program may be used for this purpose, for example the aforementioned program DRACULA, by means of which a network list description is formed in the form of a circuit layout extraction, which considers only the active components of the integrated circuit. By means of this coarse simulation computer model, a coarse simulation is carried out thereafter. In doing so, certain operating parameters are preset, such as in particular the operating temperature and the supply voltage, as well as parameters of the extraction program used and of the simulation program used. The input terminals of the coarse simulation computer model then are acted upon with test signals of predetermined signal shape. These effect at input and/or output terminals of interest of the coarse simulation computer model analog response signals which are recorded and stored as stimulation signals for the subsequent fine simulation. These stimulation signals already include a coarse consideration of the electrical behavior of the integrated circuit and thus are considerably better suited for subsequent fine simulation and result in considerably better simulation results as compared to the case in which the fine simulation starts with the application of test signals without effecting the coarse simulation before the same.

2. Thereafter, a fine-coarse computer or simulation model is made. For example, one starts with the preparation of the fine model of the cell Z of interest. In doing so, one can again make use of a conventional computer program providing the network list description with the aid of a circuit layout extraction. However, for the purpose of providing the fine model, this does not only include the active components (for example transistors and diodes) of the cell Z, but also the passive components thereof (resistors, capacitors, inductances) and all parasitic elements (shown also in the form of resistors, capacitors and inductances) which are caused by geometries on the semiconductor chip of the integrated circuit. This leads to formation of the part referred to as cell Z of the fine-coarse simulation model in FIG. 1.

3. For the completion of the fine-coarse simulation model, the coarse models $Z_R$, $Z_L$, $V_{DD}$, $V_{SS}$, $I/O_{IC}$, $M_P$ and LOAD are prepared in addition. For this purpose, it is possible to use again the conventional computer program for network list description with the aid of a circuit layout extraction, in which however, only passive circuit components in the form of complex resistors are taken into consideration.

The selection whether only active components, only passive components or all components inclusive of parasitic elements are to be included in a network list description for a simulation model can be effected, for example, by means of filters which, with respect to a particular circuit layout extraction, allow only respective components desired to enter into the network list.

In case of a package analysis for preparing a package coarse model, an equivalent circuit diagram of the package of the integrated circuit is preferably made in the form of an RLC network, with values of an individual equivalent circuit diagram components being based upon measurements. A model is made for each terminal pin of the package.

4. Upon preparation of a fine-coarse simulation model corresponding to FIG. 1, a fine simulation is carried out by way of this model. In doing so, for example the same operating parameters are preset as in the preceding coarse simulation, and as stimulation signals the response signals of the coarse simulation computer model are used that were recorded and stored during the coarse simulation. In this respect, as many parts of the fine-coarse simulation model as possible are activated by the stimulation signals, so as to bring the stimulated cell Z in all possible kinds of electrical conditions. Both transient effects are considered in this respect and also effects and reactions occurring only in a steady state.

5. At the locations of interest of the fine-coarse simulation model, signal patterns produced by the fine-coarse stimulations are scanned and recorded. Preferably such signal patterns are recorded which occur at circuit nodes leaving the integrated circuit IC, i.e., at last circuit nodes, before these are fed to an external environment of the semiconductor chip of the integrated circuit. Recording of these signal patterns takes place with an as high scanning rate as possible, which preferably is five times as high as the scanning rate demanded by the scanning theorem, in order to thus obtain a high resolution and thus good simulation results.

6. Thereafter, a spectrum analysis of the recorded and stored signal patterns of the fine-coarse simulation model is made, preferably with the aid of a Fourier transformation, by means of which a frequency spectrum of the scanned and recorded signal patterns is made. In doing so, one can make use of a "waveform postprocessor", for example a program XELGA. Parameters essential for a spectrum analysis, like scanning frequency and number of the scannings, should be taken into consideration in this respect.

A representation in the frequency range takes place preferably in double logarithmic scaling, in which an amount and a phase of a complex amplitude are represented.

7. An evaluation of the result of simulation takes place by an assessment of interference amplitudes in the frequency spectrum representation of the respective signal pattern, in which a level of the interference amplitude represents a measure for the quality of a respective circuit node regarding possible HF radiation. The evaluation and assessment are carried out for example according to known VDE guidelines or known SAE standards of the USA.

8. An improvement of an interference emission behavior of the cell of interest can be achieved by purposefully changing the integrated circuit to be examined and by carrying out steps 1. to 7. once more.

Figure 2:
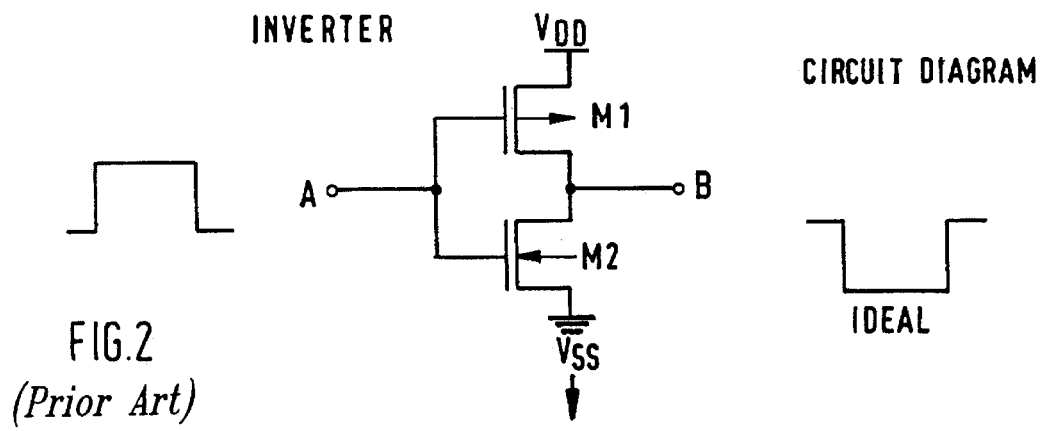
FIG. 2 shows an electrical circuit diagram of a conventional CMOS inverter.
Figure 3:
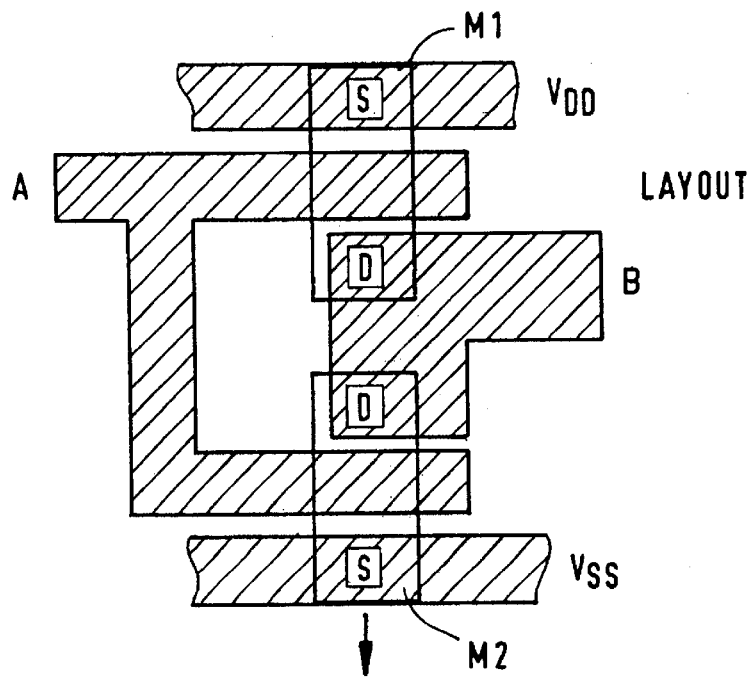
FIG. 3 shows an example of a chip layout of the inverter shown in FIG. 2.
Figure 4:
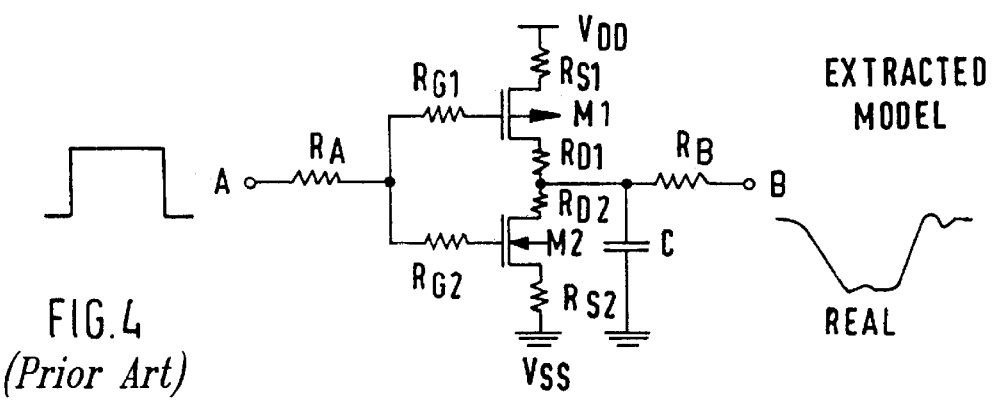
FIG. 4 shows a simulation model of the inverter extracted from the chip layout according to FIG. 3.

By way of FIGS. 2 to 4, a model extraction will be elucidated on the basis of a simple example of a CMOS inverter.

A CMOS inverter of the type shown in FIG. 2 contains two series-connected MOS transistors M1 and M2 of opposite channel-type, which are connected between the two supply voltage terminals $V_{DD}$ and $V_{SS}$ of a supply voltage source. Gate terminals of both transistors M1 and M2 are commonly connected to an input terminal A, and drain terminals thereof are commonly connected to an output terminal B. A square pulse supplied to the input terminal A causes at the output terminal B an inverted output pulse, with FIG. 2 being based on the assumption of ideal pulses and an ideal transmission characteristics of the inverter.

FIG. 3 shows a possible layout of an inverter of the type shown in FIG. 2. The MOS transistors M1 and M2 are surrounded by thick lines. Conductive tracks for the voltage supply on the one hand and on the other hand for connecting the gate terminals and the drain terminals of the two transistors M1 and M2 to input terminal A and output terminal B, respectively, are shown in hatched manner.

FIG. 4 shows a simple extracted model of an inverter having the layout shown in FIG. 3. In addition to the active components M1 and M2, only resistors and a capacitor have been included in the extracted model. A more exact model could contain additional capacitors and in addition thereto inductances, possibly also parasitic components of the transistors M1 and M2. A further refinement could reside in dividing the passive elements according to the conduction theory (e.g., with the program DIVA).

In the extracted model of FIG. 4, line resistors constituted in essence by metallic conductive tracks are considered, namely source lead resistors $R_{S1}$ and $R_{S2}$, drain lead resistors $R_{D1}$ and $R_{D2}$, gate lead resistors $R_{G1}$ and $R_{G2}$ as well as line resistors $R_A$ and $R_B$ of connecting lines with terminals A and B. In addition thereto, a capacitor C is shown between the common drain terminal and the ground line ($V_{SS}$).

Due to the consideration of such resistors and capacitors in the extracted model, the simulation of feeding an ideal square wave pulse at the input terminal A in case of this model does not result in a correspondingly ideal inverted output pulse at the output terminal B, but a "real" inverted pulse with specific pulse slopes and transient portions appears there.

A conversion of individual components or component groups of integrated circuits, which are present as circuit diagram representations, into corresponding circuit layouts nowadays can be performed automatically by computer programs. This holds also for the preparation or extraction of a computer model from such a layout. The computer program can ascertain, from samples and dimensions of such layouts, the parasitic components present in addition to the active elements in the form of transistors M1 and M2 and include the same in the extracted model as well.

In a practical case of the analysis or optimization of a cell of interest of an integrated circuit, this cell is considerably more complex than a simple inverter of the type shown in FIG. 2. The program-controlled layout preparation and/or model extraction, however, takes place basically in a same fashion.

Figure 5:
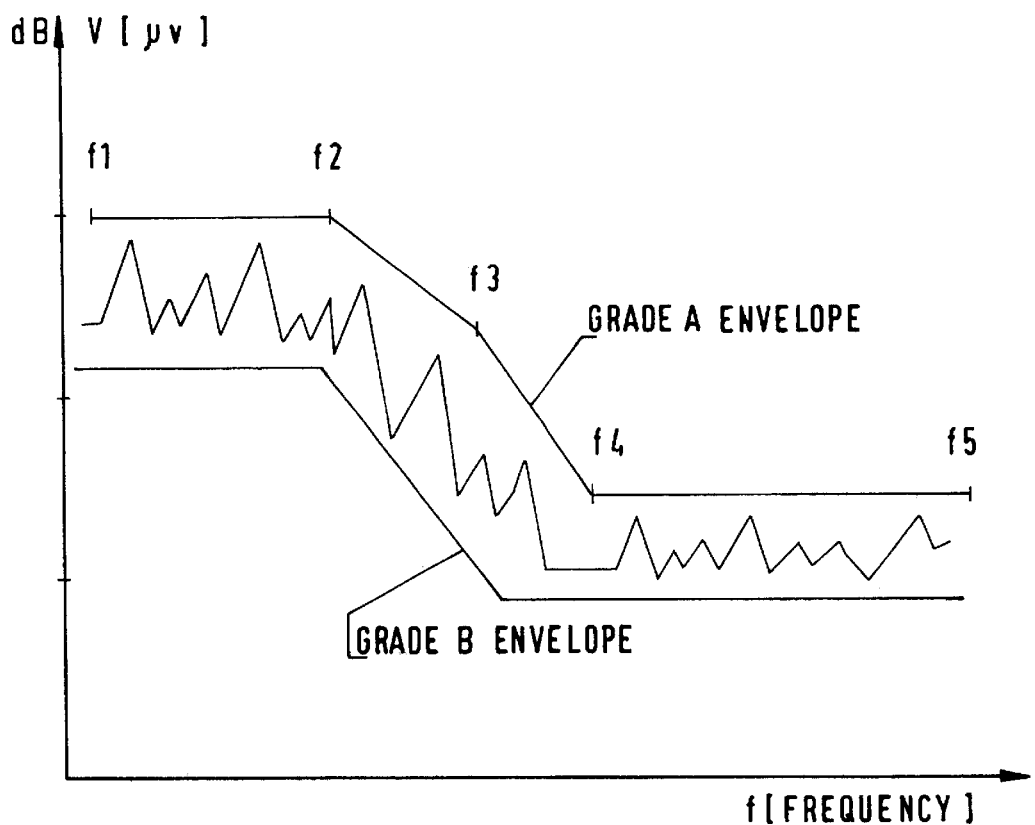
FIG. 5 shows examples of envelopes as frequency spectrum assessment master patterns.

FIG. 5 displays an assumed example for a frequency spectrum of a signal pattern obtained during the fine simulation, together with assessment envelopes having a function of assessment master patterns. Shown therein are an assumed envelope of grade X as well as an assumed envelope of grade Y. Depending on which grade is employed, the signal pattern having the frequency spectrum shown in FIG. 5 would either be acceptable or not acceptable.

Figure 6:
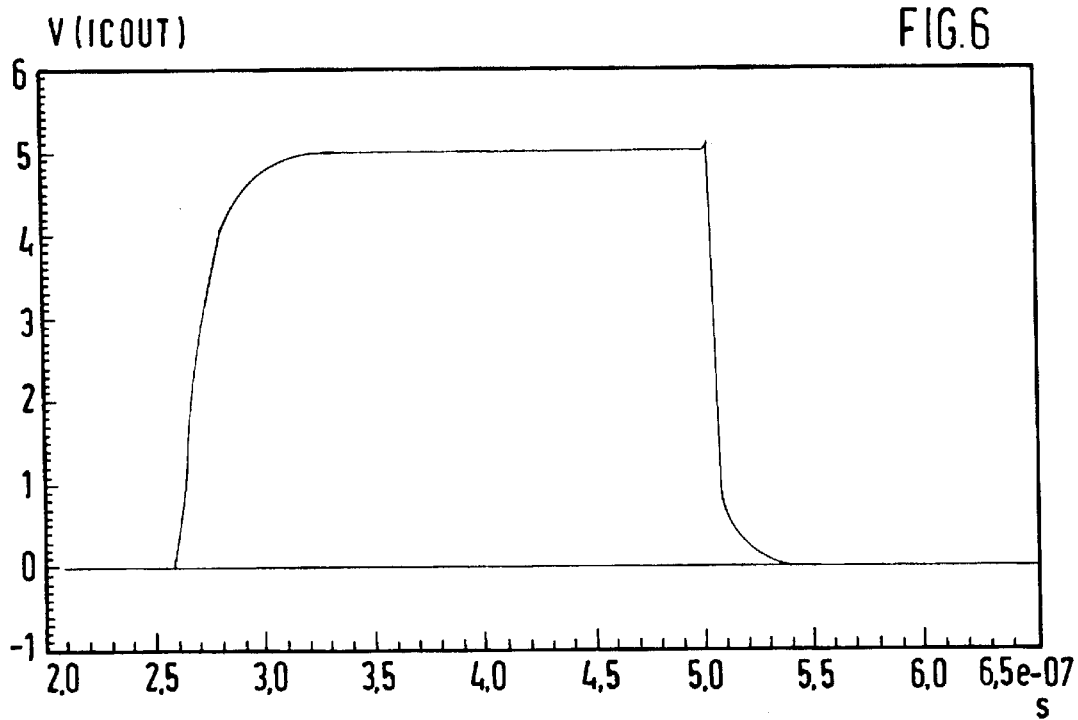
FIGS. 6 to 13 show signal patterns obtained by simulation according to the invention, before and after iterative optimization with respect to the electromagnetic emission behavior, respectively, with these figures showing in detail.
Figure 7:
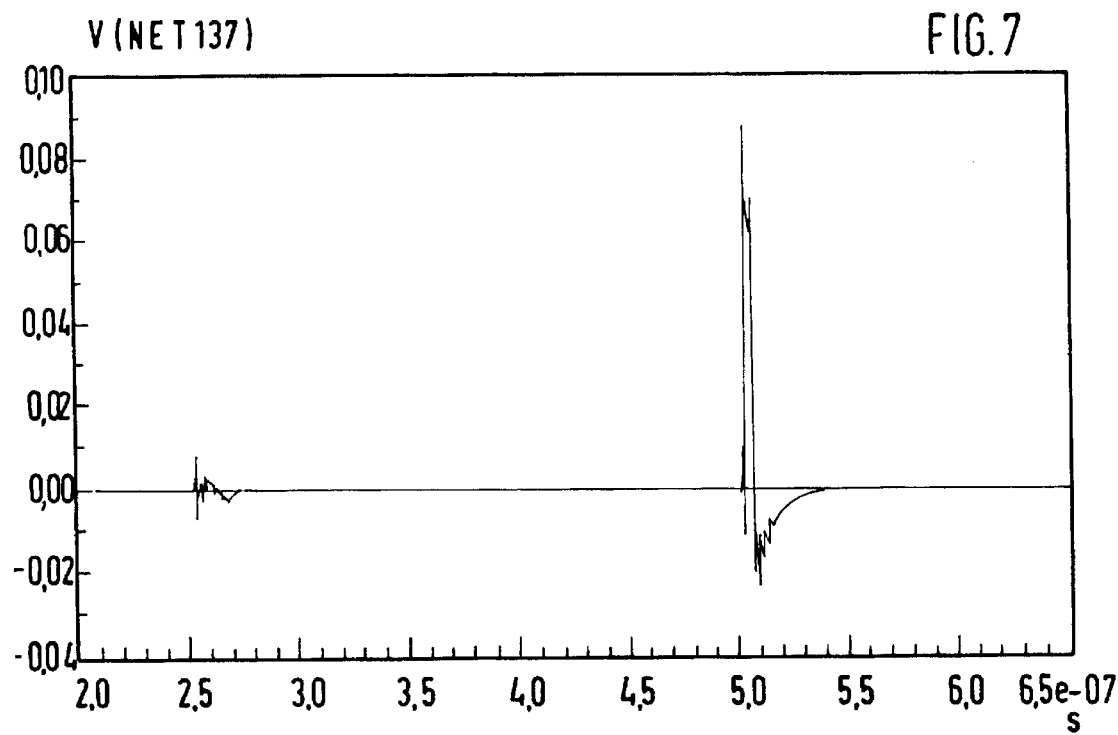
Figure 8:
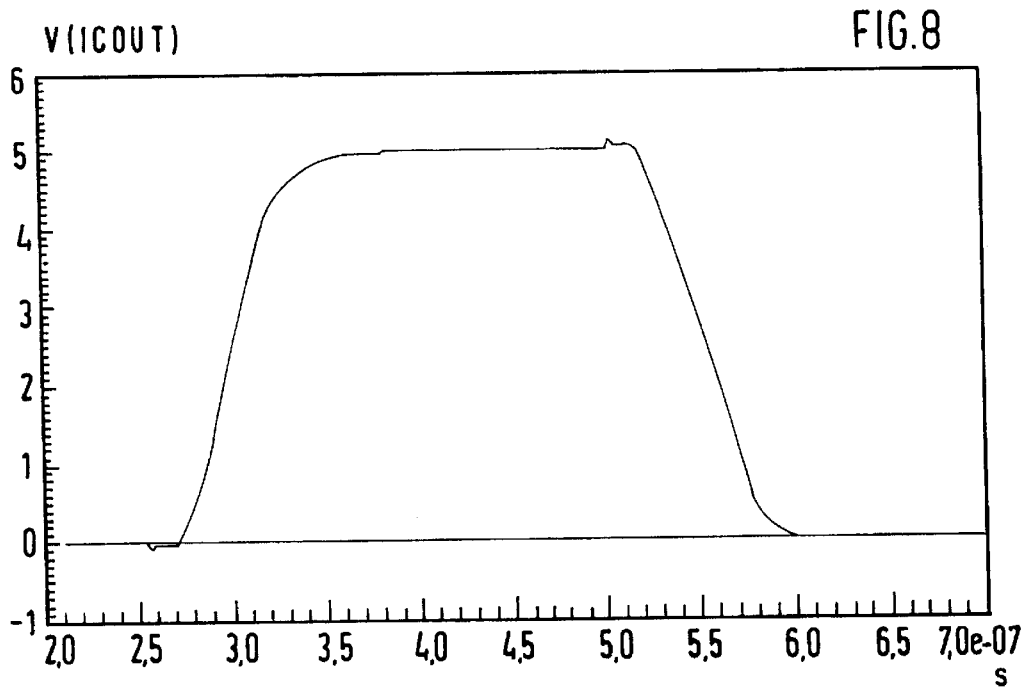
Figure 9:
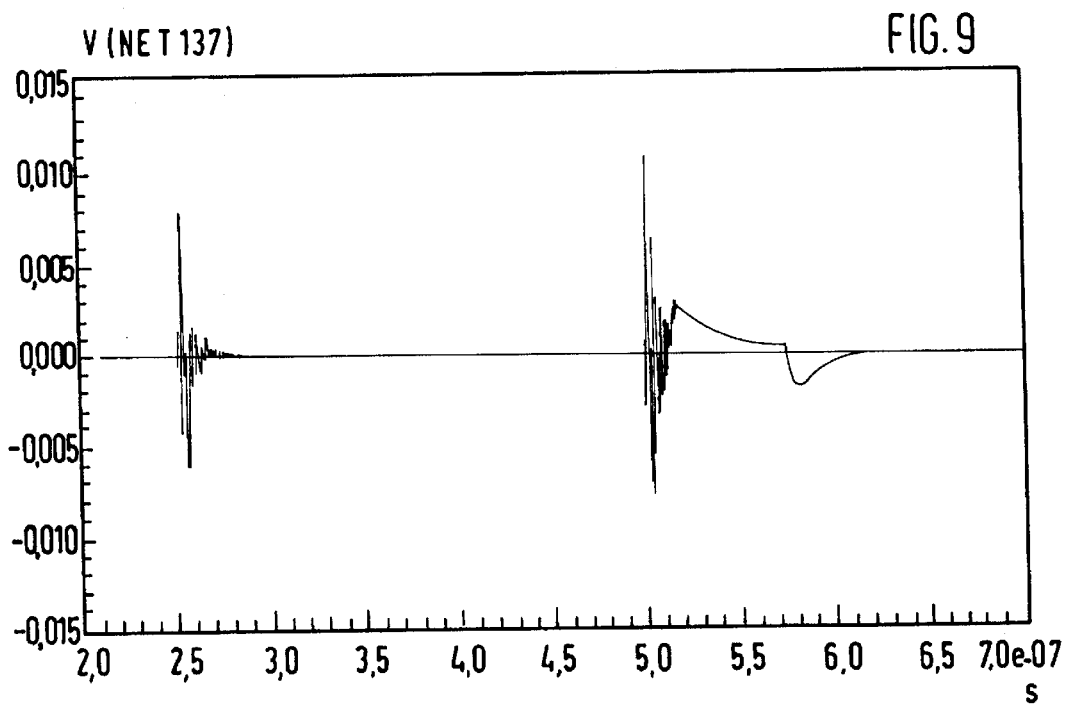

FIGS. 6 to 9 show simulated signal patterns at different locations of a simulation model of an integrated circuit prior to and after, respectively, optimization with respect to electromagnetic interference emissions by means of a simulation method according to the invention. FIGS. 6 and 8 show a simulated output signal at an output terminal of an output driver of the simulated integrated circuit before and after optimization, respectively, whereas FIGS. 7 and 9 show signal patterns at an internal voltage supply line (ground line) of the simulation model of the integrated circuit before and after simulation, respectively.

A comparison of FIGS. 6 and 8 shows as most prominent effect of the optimization a clear reduction of the steepness both of a leading edge and of a trailing edge of a pulse signal, which means a corresponding reduction of high frequency portions in this pulse signal and thus a corresponding reduction of high-frequency interference emission.

A comparison of FIGS. 7 and 9 shows that an amplitude of the interference voltage signal on the internal ground line has decreased from about 90 mV prior to optimization to about 10 mV after optimization, and thus almost by a factor of 10.

FIGS. 10 to 13 show frequency spectrums of the signal patterns obtained by the simulation at the output terminal of the simulation model of the integrated circuit and on an internal voltage supply line, respectively.

Figure 11:
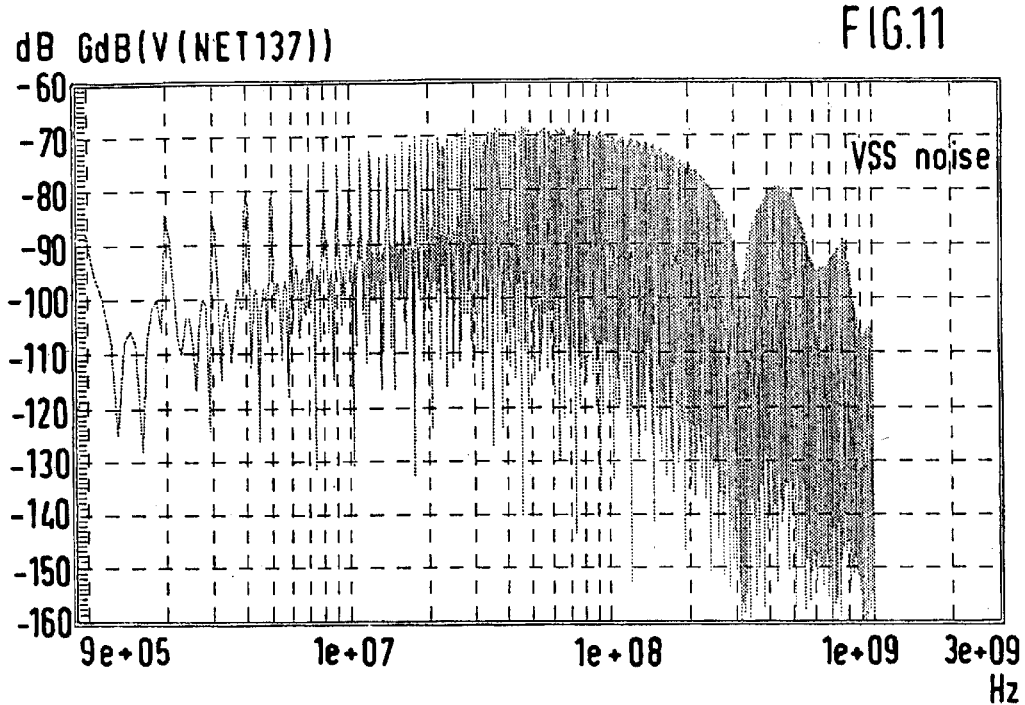
Figure 10:
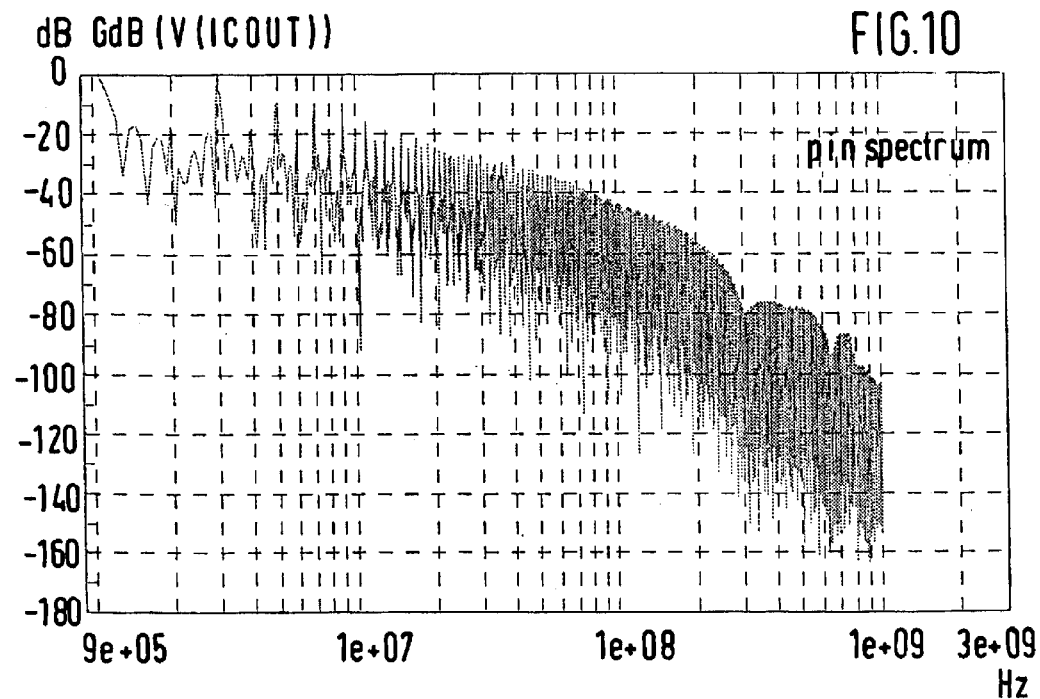
Figure 13:
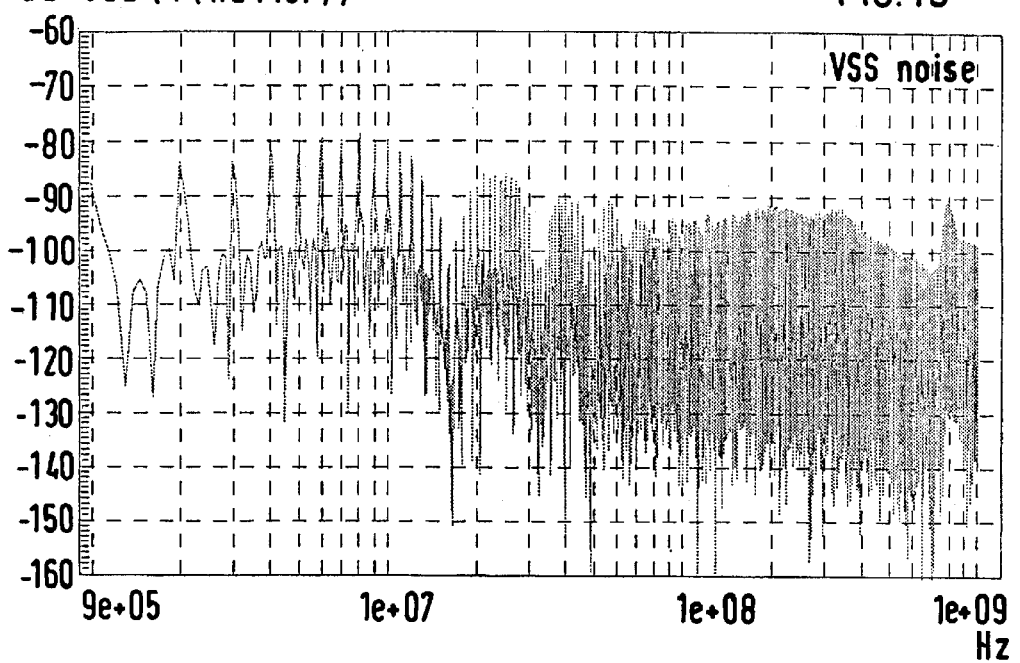
Figure 12:
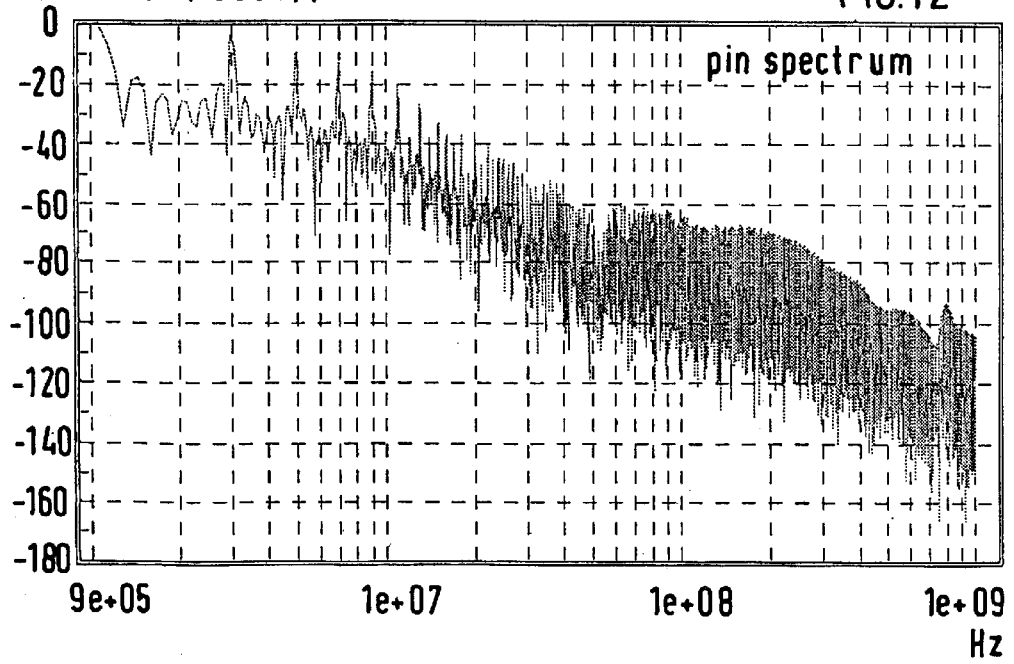

A comparison of FIGS. 10 to 12 shows a decrease in an upper envelope in a middle frequency range of the frequency spectrum for the output terminal by about 20 dB as a result of the optimization. A similar reduction in interference emission results for the simulated signal on the internal voltage supply line, as can be seen from a comparison of FIGS. 11 and 13.

The method according to the invention thus permits automatic optimization of integrated circuits by means of parameter-oriented simulators.

In another embodiment, the method can also be used for determining an interference resistance of integrated circuits against interference radiations. In this case, internal voltage supply lines, inclusive of ground lines, and/or external terminal pins of the simulation model of the integrated circuit, which may be significant or characteristic for a function of the cases of interest, may be fed with stimulation signals, and expectation can be compared with a simulation result. By way of the frequency spectrum of signal patterns recorded, the interference resistance quality of the cell of interest can be assessed. It is possible to use therefor stimulation signals the frequencies of which are wobbled and the powers and/or amplitudes of which are made different iteratively.

Prior to transferring circuits or circuit parts of an integrated circuit into other semiconductor technologies (including a change in dimension with respect to the circuit layout), the behavior thereof can be predicted by a simple exchange of the simulation model. To this end, either a new extraction can be carried out for preparing a new simulation model, possible to perform an assessment by means of a simulation model that is matched to the new semiconductor technologies.

The modularization into cells and the use of a fine-coarse computer model along with a consideration of the electrical environment of the cell of interest permits good simulation results, with the method being applicable also in case of restricted computer performance.

In addition to the possibility of improving a cell of interest with the method according to the invention, the method according to the invention can also be used for investigating in an influence of a large variety of different parameters with respect to the interference radiation behavior. Such parameters are for example package parameters, input/output structures, R, L, C networks on the chip, supply networks, clock frequencies and clock strategies, for example with regard to the form of the clock pulses, technology parameters etc.

Finally, in the following there is indicated a list of suppliers for the computer programs indicated herein-before and for other programs suitable for the method according to the invention:

| Software | Application | Supplier |
|---|---|---|
| SPICE | Analog circuit simulation | Cadence, Haar near Munich |
| DRACULA | Layout extraction (network list) layout verification | Cadence |
| DIVA | Layout extraction (network list) layout verification | Cadence |
| ELDO | Mixed mode simulation | Mentor Graphics, Munich |
| EPIC (Amps, Timemill, Powermill, ...) | Mixed mode simulation timing verification circuit analysis circuit optimization | Epic, Grenoble |
| XELGA | Waveform indication and waveform post-processor (e.g., Fourier analysis) | Mentor Graphics |
| VERILOG | Digital circuit simulation | Cadence |

All programs include so-called online-manuals and are sold and used world-wide.

Methods of the type described herein for the analysis and optimization of integrated circuits can be employed on the one hand for assessing and optimizing integrated circuits existing first only in virtual reality in a form of circuit diagrams and/or layout drawings and in a form of computer models, before such circuits are converted to reality, namely in the form of semiconductor chips. Due to the fact that a conversion into real semiconductor chips involves very high expenditure in costs and time, such assessment and optimization processes in virtual reality are greatly preferred and employed in increasing manner. A desire and aim in this respect is to achieve automation to the greatest possible extent, such that analysis and/or optimization processes according to the present invention can be incorporated in an automated program routine which, both on the starting side and on the end side, contains automated interfaces to the physical world, such that for example measuring results on an input side and production control means, for example mask formation or layout trimming means, on an output side can be combined with the analysis and/or optimization method according to the invention via an automated interface on the input side and on the output side, respectively. Continuous program control is then possible from the measuring means to the mask formation or layout trimming means, which no longer requires any manipulations or influence by human beings whatsoever.

In the following, some practical applications of such fully automated operations shall be considered.

If an integrated circuit (in the following abbreviated in usual manner as IC) is already in existence, it is possible with the assistance of the method according to the invention to perform an analysis and/or optimization of the IC, which can take place in fully automated manner. For example, an analysis and/or optimization is carried out with respect to electromagnetic interference emission of the IC as regards the effects thereof at individual terminals or pins of the IC.

At first, a pin-selective measurement of the electromagnetic radiation of the test IC is carried out. To this end, one preferably uses a measurement method according to the standardization suggestion VDE AK 767.13/14.5, as published in "Measurement of EME in Integrated Circuits," published by ZVEI Fachverband Bauelemente der Elektronik, Königstorgraben 11, 90402 Nuremberg, Version 1.1, May 1995. For pin-selective measurement, a robot may be used, which in automated manner effects pin to pin switching, so that measurements are made in succession on all or selected pins with respect to the interference emission thereof. Due to these measurements, the pin with the highest interference emission is ascertained for example. By way of a database storing which pins of the IC are connected to which cells of the IC, it is ascertained which cell or cells belong(s) to the pin selected on the basis of the interference emission measured. The method according to the invention then is carried out for a cell of the IC ascertained in this manner. To this end, it is either possible after the cell has been ascertained to prepare the fine-coarse computer model for the selected cell of the IC by way of a layout or circuit diagram analysis program and to perform the analysis method according to the invention. Another possibility consists in taking recourse to a database in which fine-coarse computer models of the type according to the invention are already stored for the individual cells of the IC, and to retrieve that fine-coarse computer model from this database which belongs to the cell ascertained by said pin-selective measurement of interference emission. This method can be carried out either until an analysis result is obtained or until an optimization is reached. The analysis or optimization result in terms of software can be utilized for controlling a program controlled IC production process, in particular a mask formation process or a conductive track trimming process, with the parameters obtained during the preceding analysis or optimization.

The entire process from pin-selective measurement to mask formation for a modified IC or for conductive track trimming of the existing IC during the manufacturing process can take place in fully automated manner, i.e., without any manipulation by human personnel. It is possible in this respect to combine individual program parts, such as the program controlling the pin-selective measurement and the robot function, the analysis or optimization program according to the invention as well as the program controlling mask formation or track trimming, via mutual program interfaces so as to form an overall program. It will then be necessary at the most to provide the individual already existing programs with suitable interfaces and/or program filters so that the individual programs in combined manner can handle, in fully automated manner, the entire process from pin-selective measurement to mask formation or track trimming.

Another possibility is the use of a method according to the invention for an assessment of the current consumption of an IC that is integrated only in virtual or already in real manner. In doing so, the layout or circuit diagram of the integrated circuit again is read in by means of a layout or circuit diagram analysis program for preparing a computer model. Thereafter, a coarse simulation of the type of the method indicated in claim 2 or claim 19 is carried out. A cell of the IC is selected on the basis of the coarse simulation result that is assessed with respect to current consumption. The current assessment preferably takes place on the basis of the type of current value change in terms of time. Cells having current consumption only or substantially only in a form of a constant direct current, and thus cause no or practically no interference emission, may be disregarded when an analysis or optimization of cells with respect to the interference emission behavior thereof is concerned. However, cells having a current consumption with high and/or frequent current intensity changes and thus have a particularly high share in causing interference emission, are selected for analysis or optimization. The simulation method according to the invention with the fine-coarse computer model then is carried out for the thus selected cell, at the end of which the parameters of the cell are determined that have been analyzed or optimized with respect to interference emission.

At the beginning of this method for assessing the current consumption, there is either a coarse simulation (in particular when only a virtual IC is present) or a measurement of the current consumption when there is an already existing IC. By means of the analysis or optimization result obtained at the end of the method, the program can again control physical quantities, for example in the mask formation for the real IC to be produced or for track trimming of an already existing IC.

Here, too, it is possible to provide a complete automation from reading in of the IC circuit diagram or from measurements of current consumption up to mask formation or track trimming, by combining the individual program parts via suitable interfaces to a functionally continuous overall program.

While the preceding examples mainly dealt with the preparation of the electrical analysis and selection, respectively, of the cell of an IC to be improved, possibilities of evaluating the electrical analysis or optimization shall be considered in more detail hereinafter.

A possible use is an automatic layout modification of an IC layout as basis for mask formation of a cell of an IC or the entire IC. Upon conversion of the already existing layout or circuit diagram of the IC to be produced, the fine-coarse computer model is generated or, as an alternative, retrieved from a database in which fine-coarse computer models are already stored for the IC to be produced. By way of this fine-coarse computer model, optimization is then carried out by means of the iteration method according to the invention. The optimization result is entered into a known per se network list program, by means of which a network list of the optimized cell is provided that leads to automatic generation of an optimized layout of the cell or of the entire IC. To this end, for example, a program LAS of the company Cadence or a corresponding program of another software producer can be utilized.

Another possibility consists in comparing various solutions for the same desired function and in having the best possible solution selected under specific aspects, for example minimization of interference emission. To this end, various cells intended for performing the same task can be analyzed and compared with respect to the behavior of interest, for example, interference emission. The cell with the best behavior can then be selected and used for the IC to be manufactured. This method may be performed for only one cell of the IC or for several different cells of the IC. Upon termination of this cell selection process, a mask layout then is prepared in consideration of the selected cell or cells, which may take place automatically by means of the overall program. This means that a throughout automatic process may take place beginning with the detection of the cells to be compared for the selection on the basis of software and ending with the preparation of a mask, without any human operation being necessary at all.

Another possibility of application of the method according to the invention is the determination of the optimum supporting capacitance of supporting capacitors that are co-integrated on the IC, and the trimming adjustment thereof to the supporting capacitance ascertained as the optimum one.

It is common practice to provide integrated circuits with integrated supporting capacitors having the function of a current buffer or a small buffer battery. These supporting capacitors act between the two voltage supply lines ($V_{DD}$ and $V_{SS}$). They are problematic since, together with inductances in particular of conductive tracks of the IC, they lead to series resonances in accordance with a known formula $$fr \approx \frac{1}{2\pi\sqrt{LC}}$$

wherein fr is the series resonance frequency, L is the conductive track inductance and C is the supporting capacitance. In the resonance frequency, there is created practically a short circuit between the two voltage supply lines. This effect is particularly undesirable when it occurs for example in the frequency range of VHF or FM radio transmitters, for example in the range of about 96 MHz.

Such an effect can also take place in integrated circuits that are not provided with supporting capacitors. The conductive tracks of integrated circuits constitute, as is known, capacitors. Such circuit board capacitors together with track inductances may also result in resonance effects that may cause disturbances.

When such resonances are in frequency ranges causing interference, such resonances in known manner can be transferred to non-critical frequency ranges by trimming the conductive tracks concerned with laser or ion beams, i.e., by removing parts of such conductive tracks. With an already existing IC, such trimming of course is possible only in one direction, since conductive tracks or electrodes of supporting capacitors can only be rendered smaller by such trimming.

Using the method according to the invention, such trimming can be carried out already by means of the coarse-fine computer model, which permits "virtual trimming" in both directions, namely in the direction of decreasing and in the direction of increasing the conductive tracks or capacitor electrodes to be trimmed. To this end, the method according to the invention can be used for analyzing a cell containing the conductive track or capacitor electrode concerned, and for optimizing the same in a "trimming operation" based on the software such that the frequencies mentioned come to lie in a non-critical frequency range. The optimization result can be entered into the control program for controlling the laser or ion beam trimming device in order to trim a capacitor electrode or conductive track already present on an IC existing in reality in accordance with the optimization result.

For example, an apparatus designated Micrion 9000 of the company Micrion in Munich is suitable therefor. This apparatus is capable of automatically controlling ICs, in a programmable manner via its control computer. Automated program conversion is possible via interfaces or filters, so that the assessment or optimization result obtained by the method according to the invention can be entered into the control program of Micrion 9000.

As mentioned hereinbefore, it is particularly advantageous to perform the trimming operation already in terms of software, before conductive tracks or capacitor electrodes to be trimmed are produced at all. Such trimming takes place before this in terms of software, and the layout and track masks are already controlled by means of this trimming result, preferably in fully automatic manner, so that the formation of such conductive tracks and capacitor electrodes takes place already with the optimized layout.

From the foregoing it will be appreciated that, although specific embodiment of the invention have been described herein for purposes of illustration, various modifications may be made without deviating from the spirit or the scope of the invention. Accordingly, the invention is not limited except as by the appended claims.

What is claimed is:

1. A method for an analysis of an electrical behavior at least of a specific cell of interest of a monolithically integrated circuit, comprising the following steps:

a) providing a coarse simulation computer model of an integrated circuit, said coarse simulation computer model taking into account active components of said circuit, said coarse simultion computer model performing a coarse simulation by using test signals that are input to the coarse simulation computer model and obtaining output signals from the coarse simulation computer model that are recorded and stored as stimulation signals;

b) providing a fine model of the cell of interest, which takes into account active and passive components and parasitic components, and c) performing a fine simulation of the fine model of the cell of interest in which the cell is acted upon with the stimulation signals recorded in step a, and signal patterns obtained thereby at output terminals of the fine model of the cell and/or the coarse simulation computer model of the integrated circuit are scanned and recorded;

d) for each circuit node of interest, a frequency spectrum of the associated signal pattern recorded is produced by means of a spectrum analysis method; and e) the frequency spectrum is assessed by comparison by means of a frequency spectrum assessment master pattern stored.

2. The method of claim 1, for improving an electromagnetic emission behavior of the cell of the integrated circuit, in which by means of a program-controlled iteration routine and in consideration of predetermined functional limits of the cell g) circuit parameters of the fine model of the cell are changed purposefully;

h) steps c) to e) are repeated by way of an amended fine-coarse computer model arising therefrom;

i) the respective assessment result obtained by the amended fine-coarse computer model is compared with an assessment result that was obtained by a preceding fine-coarse computer model;

j) it is ascertained by way of the comparison result whether the preceding change of circuit parameters of the fine model has led to an improvement or a deterioration of the electromagnetic emission behavior of the cell; and k) the iteration routine is continued with a renewed alteration of the circuit parameters of the fine model of the cell, with the circuit parameter alteration being carried out in accordance with the preceding assessment result in the same or opposite direction as in the preceding circuit parameter alteration, until an amount of the alteration of the electromagnetic emission behavior obtained by the respective circuit parameter alteration comes to lie below a predetermined threshold value.

3. The method of claim 1 wherein any combination of the following is taken into consideration for making the coarse model in addition to the model of the remainder of the integrated circuit:

a lead model taking into account the conductive wires that form leads to the cell of interest;

a voltage supply model;

an input/output structure model;

a package model; and a load model.

4. The method of claim 1 wherein steps a) and b) include the preparation, by means of a circuit layout model, of a network list description of the fine-coarse computer model and the coarse simulation computer model, respectively, which takes into account passive and parasitic elements in the form of resistors (R), capacitors (C) and inductances (L) and active elements in the form of transistors and diodes.

5. The method of claim 1 wherein the coarse simulation according to step a) is performed with periodic input stimuli that result in periodic output patterns.

6. The method of claim 1 wherein, in the scope of step c), a signal pattern is recorded that arises on at least one output circuit node of the integrated circuit.

7. The method of claim 1 wherein scanning in the scope of step c) is performed with a scanning frequency that is at least as high as a scanning frequency demanded by a scanning theorem.

8. The method of claim 7 wherein scanning is carried out with a scanning frequency that is at least five times as high as the scanning frequency demanded by the scanning theorem.

9. The method of claim 1 wherein the signal patterns to be analyzed are subjected to a Fourier transformation in step d).

10. The method of claim 1 wherein the signal patterns to be analyzed are subjected to a Z transformation in step d).

11. The method of claim 1 wherein, in the scope of the preparation of the fine model in step b), the parasitic components present between two circuit nodes each are at first extracted in the form of a complex impedance by means of a conventional program-controlled extraction method and said impedance then is converted by means of a computer program into an equivalent network with distributed impedance elements.

12. A method for an analysis of electrical behavior of a monolithically integrated circuit having at least one specific cell of interest, said method comprising the steps of:

providing a coarse simulation computer model of an integrated circuit;

presetting predetermined operating parameters to the integrated circuit;

performing a coarse simulation by feeding input terminals of the coarse simulation computer model with test signals of predetermined signal form;

recording and storing analog response signals at input and/or output terminals of the cell of interest of the coarse simulation computer model;

providing a fine-coarse computer model of the integrated circuit, said fine-coarse computer model including a fine model of the cell of interest and a coarse model of the rest components of the integrated circuit;

presetting predetermined operating parameters of the integrated circuit;

performing a fine simulation by providing the stored analog response signals as the stimulation signals to at least one input of the fine model of the cell of interest;

scanning and recording output signal patterns from output terminals of the cell and/or the integrated circuit;

performing a frequency spectrum analysis to signal patterns of each circuit node of interest; and assessing the frequency spectrum analysis by comparing frequency spectrums of a stored master pattern with the recorded signal pattern.

13. The method of claim 12 wherein presetting the predetermined operating parameters comprises presetting an operating temperature and a supply voltage.

14. The method of claim 12 wherein the fine-coarse computer model is provided by a layout or a circuit diagram analysis program.

15. The method of claim 14 wherein the layout or circuit diagram analysis program generates a network list description of the fine-coarse computer model which takes into account the passive and the parasitic components in the form of resistors, capacitors and inductances and the active components in the form of transistors and diodes.

16. The method of claim 14, prior to providing the fine-coarse computer model, further comprising:

providing a coarse simulation computer model by the layout or the circuit diagram analysis program to the integrated circuit;

presetting predetermined operating parameters to the integrated circuit;

performing a coarse simulation by feeding input terminals of the coarse simulation computer model with test signals of predetermined signal form;

recording and storing analog response signals at input and/or output terminals of the cell of interest of the coarse simulation computer model;

providing the stored analog response signals as the stimulation signals for the later fine simulation;

selecting a cell of interest on the basis of the coarse simulation; and assessing and storing a current consumption level of the cell.

17. The method of claim 16 wherein a final circuit parameters result on the basis of the optimized current consumption level is utilized in controlling a program-controlled IC production process for automatic layout modification.

18. The method of claim 17 wherein the IC production process comprises a mask formation process or a conductive track trimming process.

19. The method of claim 18 wherein all steps are performed automatically by a computer controlled program.

20. The method of claim 12 wherein the fine model comprises active, passive, and parasitic components and the coarse model comprises passive components in a form of complex resistors.

21. The method of claim 12 wherein the coarse simulation computer model comprises only active components.

22. The method of claim 12, after the step of assessing the frequency spectrum analysis, further comprising:

changing circuit parameters of the fine model of the cell by considering predetermined functional limits of the cell to provide an amended fine-coarse computer model;

repeating the step of performing the fine simulation to the step of assessing the frequency spectrum analysis by a program-controlled iteration routine by way of the amended fine-coarse computer model arising therefrom;

comparing an assessment result obtained by the amended fine-coarse computer model with an assessment result that was obtained by a preceding fine-coarse computer model;

assessing the comparison result to determine whether a change of the circuit parameters to the fine model has led to an improvement or a deterioration of the electromagnetic emission behavior of the cell;

altering the circuit parameters of the fine model of the cell according to the preceding determination of improvement or deterioration; and continuing the iteration routine with a renewed alteration of the circuit parameters of the fine model of the cell until an amount of the alteration of the electromagnetic emission behavior obtained comes to lie below a predetermined threshold value.

23. The method of claim 22, prior to the step of providing a fine-coarse computer model, further comprising following steps:

selecting a pin or pins of the integrated circuit for measurement of interference emission;

measuring the interference emission of each pin selected;

ascertaining a pin with a highest interference emission;

ascertaining a cell or cells associating to the ascertained pin; and preparing a fine-coarse computer model for the ascertained cell or cells of the integrated circuit.

24. The method of claim 23 wherein the steps of selecting the pin or measuring the interference emission may be accomplished by a robot.

25. The method of claim 24 wherein the step of preparing a fine-coarse computer model may be accomplished by retrieving an already-stored fine-coarse computer model of the ascertained cell or cells and the integrated circuit in a data base.

26. The method of claim 23 wherein a final assessment result of circuit parameters optimized is utilized in controlling a program-controlled IC production process for automatic layout modification.

27. The method of claim 26 wherein the IC production process comprises a mask formation process or a conductive track trimming process.

28. The method of claim 26 wherein all steps are performed fully automatically by a computer program controlled process.

29. The method of claim 12 wherein any combination of following models may be taken into consideration for making the coarse model in addition to the model of the rest components of the integrated circuit:

a lead model taking into account the conductive wires that form the leads to the cell of interest;

a voltage supply model;

an input/output structure model;

a package model; and a load model.

30. The method of claim 12 wherein the coarse simulation is carried out with test signals resulting in an as periodic as possible mode of operation of the coarse simulation computer model.

31. The method of claim 12 wherein the preset operating parameters comprise typical operating conditions for the integrated circuit.

32. The method of claim 12 wherein the preset operating parameters comprise typical operating conditions for the integrated circuit.

33. The method of claim 12 wherein the preset operating parameters comprise worst operating conditions for the integrated circuit.

34. The method of claim 12 wherein the scanning of the output signal patterns is performed with a scanning frequency that is at least as high as a scanning frequency demanded by a scamning theorem to generate a sufficiently accurate result.

35. The method of claim 12 wherein the scanning of the output signal patterns is performed with a scanning frequency that is at least five times as high as the scanning frequency demanded by the scanning theorem.

36. The method of claim 12, further comprising performing a Fourier Transformation analysis for the frequency spectrum analysis.

37. The method of claim 12, further comprising performing a Z Transformation analysis for the frequency spectrum analysis.

38. The method of claim 12, further comprising:
extracting parasitic components of the fine model in the form of a complex impedance by means of a conventional program-controlled extraction method; and
converting the extracted complex impedance into an equivalent network list with distributed impedance elements.

39. The method of claim 12, prior to the step of providing a fine-coarse computer model, further comprising the following steps:
selecting a pin or pins of the integrated circuit for measurement of interference emission;
measuring the interference emission of each pin selected;
ascertaining a pin with a highest interference emission;
ascertaining a cell or cells associating to the ascertained pin; and
preparing a fine-coarse computer model for the ascertained cell or cells of the integrated circuit.

40. The method of claim 39 wherein the steps of selecting the pin or measuring the interference emission are accomplished by a robot.

41. The method of claim 39 wherein the step of preparing a fine-coarse computer model is accomplished by retrieving an already-stored fine-coarse computer model of the ascertained cell or cells and the integrated circuit in a data base.

42. The method of claim 39 wherein a final assessment result of circuit parameters is utilized in controlling a program-controlled IC production process for automatic layout modification.

43. The method of claim 42 wherein the IC production process comprises a mask formation process or a conductive track trimming process.

44. The method of claim 43 wherein all steps are performed fully automatically by a computer program controlled process.

45. The method of claim 12, after performing the coarse simulation, further comprising:
selecting a cell of interest on the basis of the coarse simulation; and
assessing a current consumption level of the cell.

46. The method of claim 45 wherein a final assessment result of the current consumption is utilized in controlling a program-controlled IC production process for automatic layout modification.

47. The method of claim 46 wherein the IC production process comprises a mask formation process or a conductive track trimming process.

48. The method of claim 47 wherein all steps are performed automatically by a computer controlled program.

49. The method of claim 12 further comprising:
providing a second cell performing the same task as the cell of interest analyzed;
providing a fine-coarse computer model to the second cell and the integrated circuit;
performing a fine simulation of the second cell and the integrated circuit;
assessing a simulation result of the second cell with a simulation result of the cell of interest;
choosing a cell between the second cell or the cell of intrest with best electrical behavior on the basis of the simulation; and
performing an automatic layout for the chosen cell and the integrated circuit by a program-controlled IC production process.

50. A method for optimizing conductive track capacitance of an integrated circuit, comprising:
providing a coarse simulation computer model of the integrated circuit;
presetting predetermined operating parameters to the integrated circuit;
performing a coarse simulation by feeding input terminals of the coarse simulation computer model with test signals of predetermined signal form;
recording and storing analog response signals at input and/or output terminals of the cell of interest of the coarse simulation computer model;
providing a fine-coarse computer model of the integrated circuit, said fine-coarse computer model including a fine model of the cell containing the conductive track or capacitor electrode concerned, and a coarse model of the rest components of the integrated circuit;
presetting predetermined operating parameters of the integrated circuit;
performing a fine simulation by providing the stored analog response signals as the stimulation signals to at least one input of the fine model of the cell;
scanning and recording output signal patterns from output terminals of the cell and/or the integrated circuit;
performing a frequency spectrum analysis to signal patterns of each circuit node of interest;
assessing the frequency spectrum analysis by comparing frequency spectrums of a stored master pattern with the recorded signal pattern;
changing circuit parameters of conductive track of the fine model of the cell by considering predetermined functional limits of the cell to provide an amended fine-coarse computer model;
repeating the step of performing the fine simulation to the step of assessing the frequency spectrum analysis by a program-controlled iteration routine by way of the amended fine-coarse computer model arising therefrom;
comparing an assessment result obtained by the amended fine-coarse computer model with an assessment result that was obtained by a preceding fine-coarse computer model;
assessing the comparison result to determine whether a change of the circuit parameters to the fine model has led to an improvement or a deterioration of the electromagnetic behavior of the cell;

altering the circuit parameters of the fine model of the cell according to the preceding determination of improvement or deterioration;

continuing the iteration routine with a renewed alteration of the circuit parameters of the fine model of the cell until an amount of the alteration of the electromagnetic behavior obtained comes to lie between a predetermined non-critical frequency range; and automatically generating a layout according to the optimized circuit parameters by a computer controlled IC manufacture process.

51. A method of simulating operation of a cell in an integrated circuit using computer modeling, comprising:

providing a fine computer model of the operation of the cell;

providing a coarse simulation computer model of the operation of the integrated circuit of which the cell is a part;

performing a coarse simulation of portions of the integrated circuit other than of the cell, which includes storing an output signal passing from the coarse simulation computer model; and performing a fine simulation of the cell, which includes using the signal from the coarse simulation computer model at an input to the fine model of the cell.

52. The method according to claim 51, further including:

performing the coarse simulation with predetermined operating parameters;

obtaining an output signal from the coarse simulation computer model based on the predetermined operating parameters; and applying stimulation signals to the fine computer model based on the output signal received from the coarse simulation computer model for the predetermined operating parameters.

53. The method of claim 51, further including:

after performing the coarse simulation;

selecting a cell for the performance of the fine simulation model criteria obtained from the coarse model.

54. The method of claim 53 wherein the criteria for selection is the current consumption of a cell.

55. The method of claim 51 wherein the coarse model includes a simulation of the lead line connected to a cell of interest and the pins external to the integrated circuit.

* * * * *